(12) United States Patent
Venkatraman et al.

(10) Patent No.: US 7,082,067 B2
(45) Date of Patent: Jul. 25, 2006

(54) CIRCUIT FOR VERIFYING THE WRITE SPEED OF SRAM CELLS

(75) Inventors: Ramnath Venkatraman, San Jose, CA (US); Ruggero Castagnetti, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 35 days.

(21) Appl. No.: 10/934,970

(22) Filed: Sep. 3, 2004

(65) Prior Publication Data

US 2006/0050600 A1    Mar. 9, 2006

(51) Int. Cl.
    G11C 29/00    (2006.01)
    G11C 11/00    (2006.01)
    G11C 7/10    (2006.01)
    G11C 8/00    (2006.01)
    H03K 3/03    (2006.01)

(52) U.S. Cl. ............... 365/201; 365/154; 365/189.08; 365/189.11; 365/233; 365/239; 331/57

(58) Field of Classification Search ............ 365/201, 365/154; 331/57
    See application file for complete search history.

(56) References Cited

U.S. PATENT DOCUMENTS

| | | | | |
|---|---|---|---|---|
| 6,255,701 B1 * | 7/2001 | Shimada | ........ | 257/384 |
| 6,334,120 B1 * | 12/2001 | Shibata et al. | ........ | 706/33 |
| 6,373,290 B1 * | 4/2002 | Forbes | ........ | 326/98 |
| 6,452,459 B1 * | 9/2002 | Chan et al. | ........ | 331/57 |
| 6,493,851 B1 * | 12/2002 | Bach et al. | ........ | 716/4 |
| 6,774,734 B1 * | 8/2004 | Christensen et al. | ........ | 331/57 |
| 6,867,613 B1 * | 3/2005 | Bienek | ........ | 324/765 |
| 2004/0061561 A1 * | 4/2004 | Monzel et al. | ........ | 331/57 |
| 2004/0091096 A1 * | 5/2004 | Chen et al. | ........ | 379/300 |

FOREIGN PATENT DOCUMENTS

JP    62140300 A  *  6/1987
JP    09294055 A  *  11/1997

* cited by examiner

*Primary Examiner*—Amir Zarabian
*Assistant Examiner*—Ly Duy Pham
(74) *Attorney, Agent, or Firm*—Strategic Patent Group

(57) ABSTRACT

A circuit for measuring the performance of a memory cell. The circuit includes a ring oscillator, which includes a plurality of memory cells. The performance of the memory cell can be determined from an oscillation frequency of the ring oscillator. The circuit accurately verifies the performance of the memory cell without modifying the memory cell. This avoids altering the transient AC characteristics of the memory cell when predicting its performance.

36 Claims, 4 Drawing Sheets

CIRCUIT FOR VERIFYING THE WRITE SPEED OF SRAM CELLS

FIELD OF THE INVENTION

The present invention relates to memory cells, and more particularly to a circuit for verifying the write speed of SRAM cells.

BACKGROUND OF THE INVENTION

SRAM cells are commonly used in the industry in the form of single port, dual port, and multiport memory cells. The performance of a memory cell is commonly measured by the read-access time and write time. Many factors influence these parameters. Among the primary factors are device drive currents and parasitic capacitances due to junctions, gates, and interconnects.

Read-access time is primarily influenced by the cell current and bitline capacitance. The writing of a data state into an SRAM cell is commonly performed by turning on the wordline and the driving the bitlines to mutually opposite rail voltages in order to force the internally contained latch to switch states. This operation is a strong function of a) the strength of the pass gate in relation to the pull-up device in the memory cell and b) the capacitance of the internal nodes of the memory cell.

The latter factor is of great importance and can be a limiting factor in the overall performance of a memory cell. This is especially true in the case of multiport memory cells (such as 6-port or 8-port), because multiport memory cells can have significantly higher internal node capacitances compared to single port memory cells. For example, the addition of each differential (dual-ended) write/read port entails at least the addition of some diffusion capacitance to the internal nodes, whereas the addition of each single-ended read port entails at least the addition of some gate capacitance at the internal node.

A large internal node capacitance can result in a situation where the switching of the internal nodes during writing can be extremely asymmetric with respect to time. For example, FIG. 1 is a graph showing the voltage behavior of two internal storage nodes of an SRAM cell during a write operation.

Typically, at a storage node, a voltage transition from a logical zero ("0") to a logical one ("1") is substantially slower than a voltage transition from a "1" to a "0". Line 52 represents the behavior of one storage node transitioning from a "1" to a "0". Line 54 represents the behavior of the other storage node transitioning from a "0" to a "1". As shown, the "crossover" point can be extremely skewed due to the slow rise in voltage of a storage node. This is caused by high internal node capacitance within the memory cell. To enable a reliable write operation, the rising node needs to rise to a sufficiently high voltage before the wordlines are turned off. Consequently, the write speed slows down. Because this situation may be unavoidable, it is therefore important to be able to accurately predict and verify the transient AC behavior during a write operation.

There are multiple methods used to verify the electrical performance of a circuit. One conventional solution of verifying the DC electrical performance of an SRAM circuit is to obtain DC measurements of the individual transistor devices at different PVT (process, voltage and temperature) corners. These measurements can yield useful information for verifying the accuracy of the transistor SPICE models. However, a problem with this solution is that it does not address issues described above related to transient (AC) behavior.

The AC performance of circuits have been obtained using simple ring-oscillator structures. For the application at hand, that is, the verification of write speed of complex SRAM bitcells, a direct application of ring oscillator type of test structure has not been possible. This is because in order to conventionally access the internal node of a bitcell, an additional wire would have to be attached to it. The problem with this approach is that the wire itself would add internal node capacitance and alter the write characteristics of the bitcell.

Accordingly, what is needed is an improved circuit for verifying the write speed of SRAM cells. The system and method should be simple, cost effective and capable of being easily adapted to existing technology. The design of the test circuit should reflect the true layout of the SRAM bitcell array so that the design itself does not affect the measurement results. The present invention addresses such a need.

SUMMARY OF THE INVENTION

The present invention provides a circuit for measuring the performance of a memory cell. The circuit includes a ring oscillator, which includes a plurality of memory cells. The performance of the memory cell can be determined from an oscillation frequency of the ring oscillator. The circuit accurately verifies the performance of the memory cell without modifying the memory cell. This avoids altering the transient AC characteristics of the memory cell when predicting their performance.

DETAILED DESCRIPTION OF THE INVENTION

The present invention relates to memory cells, and more particularly to a circuit for verifying the write speed of SRAM cells. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown, but is to be accorded the widest scope consistent with the principles and features described herein.

The present invention provides a test structure that uses a ring oscillator that incorporates standard memory cells. The electrical performance of a memory cell can be determined from an oscillation frequency of the ring oscillator.

Although the present invention disclosed herein is described in the context of multiport SRAM cells, the present invention may apply to other types of cells, including single port cells, and still remain within the spirit and scope of the present invention.

Figure 1:
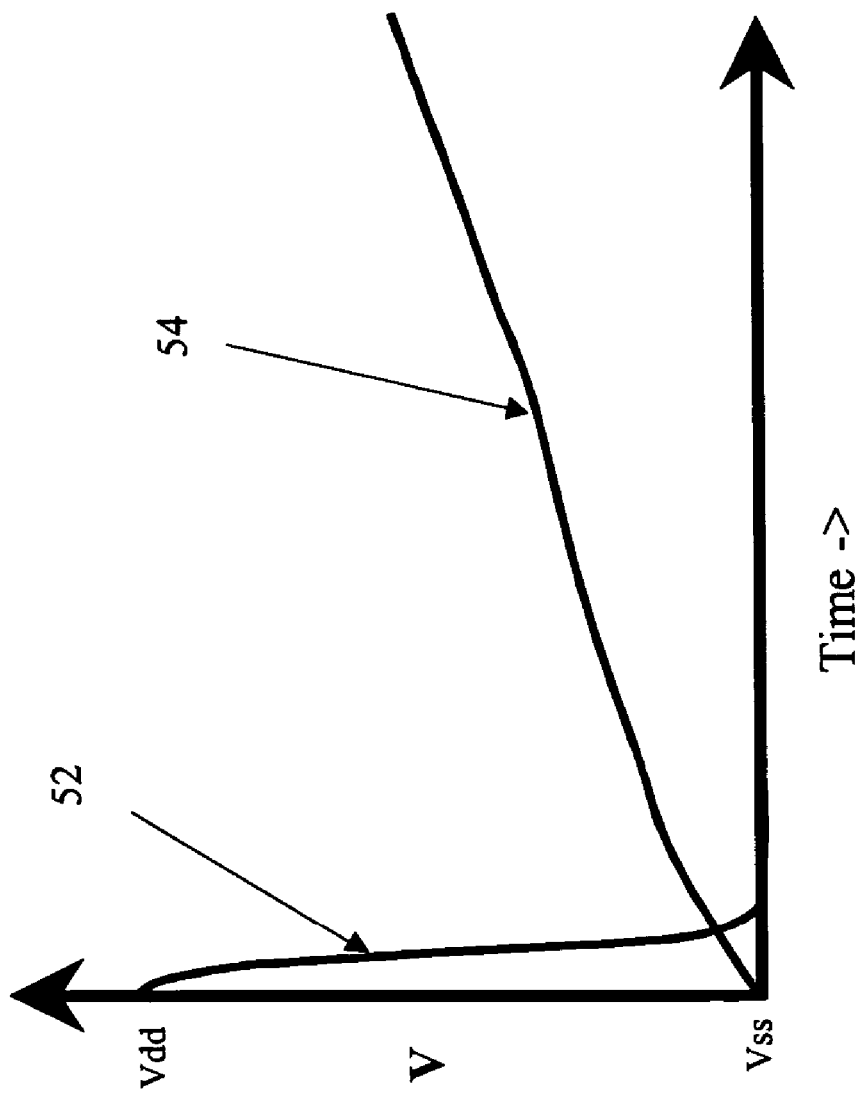
FIG. 1 is a graph showing the voltage behavior of two internal storage nodes of an SRAM cell during a write operation.
Figure 2:
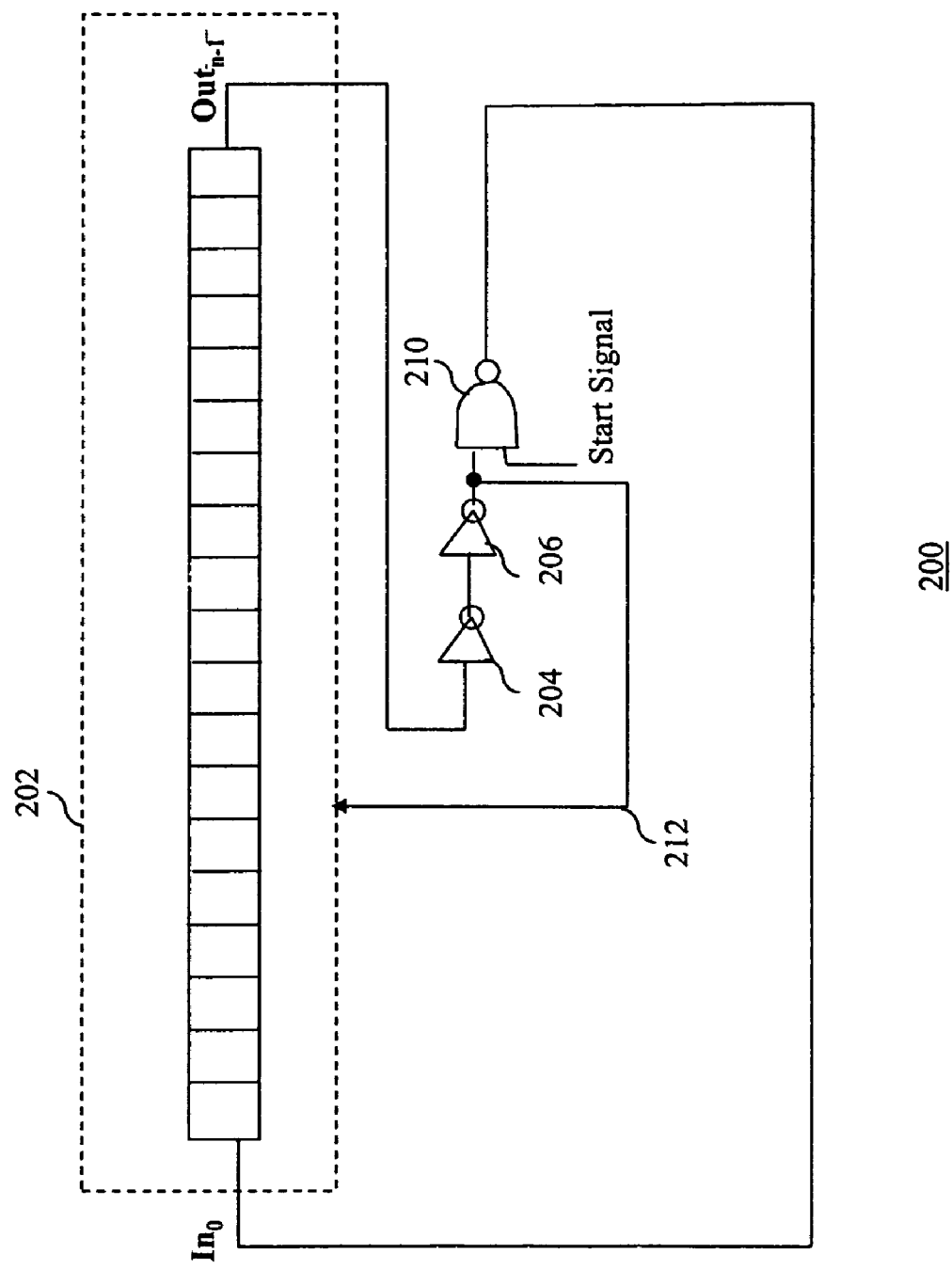
FIG. 2 is a schematic diagram of a ring oscillator circuit in accordance with the present invention.

FIG. 2 is a schematic diagram of a ring oscillator circuit 200 in accordance with the present invention. The ring oscillator circuit 200 includes a set of repeating units 202, inverters 204 and 206, and a NAND gate 210. The NAND gate 210 has two inputs, one of which is a start signal, which is at "1", when the ring oscillator 200 is turned on. When the ring oscillator 200 is turned on, the output of the NAND gate 210 toggles as the ring oscillator 200 oscillates. The operation of the ring oscillator circuit 200 is described in detail below in conjunction with FIG. 3.

Figure 3:
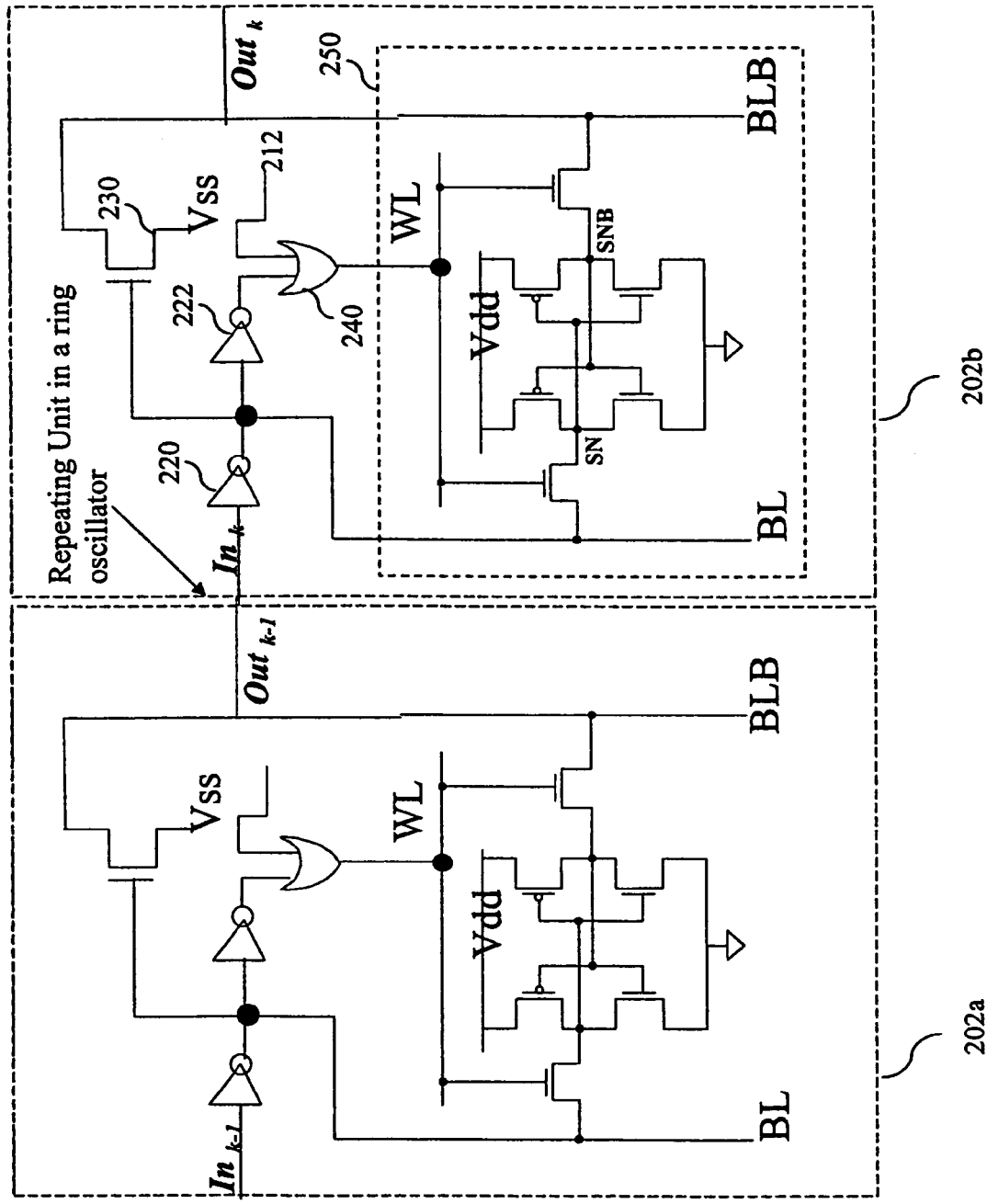
FIG. 3 is a schematic diagram of two repeating units of the set of the repeating units of FIG. 2 in accordance with the present invention.

FIG. 3 is a schematic diagram of two repeating units 202a and 202b of the set of the repeating units 202 of FIG. 2 in accordance with the present invention. The repeating units 202a and 202b are identical. For ease of illustration, the repeating unit 202b is described in detail. The repeating unit 202b includes, inverters 220 and 222, an NMOS transistor 230, an OR gate 240, and an SRAM cell 250. Note that like the repeating unit 202b, each repeating unit includes an SRAM cell. Note also that in FIG. 3 for convenience, the SRAM cell shown is a single port cell. This cell can be replaced by dual port or in general multiport cells.

In operation, referring to both FIGS. 2 and 3 together, the ring oscillator 200 verifies the write performance of the SRAM cells. The write performance can be ascertained from the oscillation frequency of the ring oscillator 200, which is a function of the time required to program the SRAM cells in the repeating units. Two cycles constitute one oscillation. During a cycle 1, a data state "0" is programmed into the SRAM cells in the repeating units, and during a cycle 2 a data state "1" is programmed into the SRAM cells. Referring to FIG. 2, during each cycle, the SRAM cells are programmed such that the programming propagates from one end (In0) of the set of repeating units 202 to the other end (Outn−1) until all SRAM cells are programmed.

The oscillator delay associated with programming a "0" into all of the SRAM cells is longer than the delay associated with programming a "1" into all of the SRAM cells. The ratio between cycle 1 and cycle 2 can be 30 to 1, for example. This ratio can be adjusted by modifying the speed of the individual transistors outside the SRAM cell. It is important to have a high ratio of cycle 1 delay time to cycle 2 delay time. This is because the delay associated with cycle 1 reflects the true write time of the SRAM cell.

To begin describing the operation of the ring oscillator 200, it is assumed that all SRAM cells are pre-set to "1". At the beginning of cycle 1, the output $Out_{n-1}$ of the set of repeating units 202 is at "0", and the input of the set of repeating units 202 is at "1". Referring to the repeating unit 202b of FIG. 3, the input $In_k$ and the output $Out_k$ are initially at "0". As such, the output of the inverter 220 and the node BL are at "1", and the transistor 230 is on, pulling the output node $Out_k$ (node BLB) to "0". During the operation of the ring oscillator 200, the wordline WL is pulled to "1". (The operation of the wordline WL is described in more detail below.) Also, the "0" at the node BLB is transferred to the storage node SNB. Node SN is at "1" due to the action of the cross-coupled inverters within the SRAM cell. Accordingly, the data state of the SRAM cell 250 is at "1".

A data state "0" is achieved when the internal storage node SN is at "0" and the internal storage node SNB is at "1". During cycle 1 (where all SRAM cells are programmed to "0"), the input $In_k$ goes from "0" to "1". The output of the inverter 220 becomes "0" driving the node BL to "0". Because the output of the inverter 220 is at "0", the transistor 230 turns off, and the node BLB floats and slowly ramps up to "1". Since the wordline WL is at "1", the "0" at the node BL transfers to the internal storage node SN. Due to the "1" at the node BLB as well as the action of the cross-coupled inverters within the SRAM cell, the internal node SNB rises in voltage. Accordingly, the data state of the SRAM cell 250 is at "0". As the voltage of the output node $Out_k$ (node BLB) increases, it passes it to the next repeating unit. This process is repeated for the entire row of SRAM cells until a data state "0" is written to all of them. Because of the slow ramp up time associated with the SNB node during the "0" programming, cycle 1 is relatively long compared to cycle 2 (where all SRAM cells are programmed to "1").

During cycle 2, a data state "1" is achieved when a "1" is written to the internal storage node SN and a "0" is written to the internal storage node SNB. Accordingly, during cycle 2, the input $In_k$ goes from "1" to "0". The output of the inverter 220 becomes "1", driving the node BL to "1". Because the output of the inverter 220 is at "1", the transistor 230 turns on, pulling the node BLB to Vss, or "0". Because the wordline WL is at "1", the "0" at the node BLB transfers to the internal storage node SNB and the internal storage node SN ramps up in voltage. Accordingly, the data state of the SRAM cell 250 is at "1". The "0" from the output node $Out_k$ (node BLB) passes to the next repeating unit. This process is repeated for the entire row of SRAM cells until a data state "1" is written to all of them. The $Out_k$ goes from "1" to "0" as quickly as the transistor 230 switches on. Hence, cycle 2 occurs relatively fast compared to cycle 1.

With regard to the wordline WL, referring again to both FIGS. 2 and 3 together, the signal at a node 212 ensures that the wordlines WL are turned on throughout cycle 2. Accordingly, at the end of cycle 1 (all SRAM cells are programmed to "0"), the node 212 is at "1" and remains at "1" until the end of cycle 2. When the node 212 is at "1", it pulls the wordline WL to "1" (FIG. 3). At the end of cycle 2, the set of repeating units outputs a "0", which brings the node 212 to "0", thus turning off the wordline WL. At the beginning of cycle 1, the input at the set of repeating units 202 is at "1". This causes the OR gate of the first repeating unit to output a "1", which pulls the wordline WL back to "1". Hence, the wordline WL is momentarily at "0" at the end of cycle 2, and is at "1" the remainder of the time.

As described above, the ring oscillator delay associated with writing a "0" into an SRAM cell 250 is relatively slow compared to writing a "1" to the SRAM cell 250, because the node BLB is left floating after being precharged to Vss. This is different from a normal mode operation where the node BLB would be actively driven to Vdd. Accordingly, during a test mode operation, write speeds are slower. However, this effect can be taken into account during the electrical simulation of the ring oscillator 200, which is to be compared with experimental results.

Measurements can be made anywhere in the ring oscillator, and such measurements can be used to obtain various characteristics and parameters of the write performance of the SRAM cells. The write speed per cell can be ascertained from the number of oscillations during a given time period and factoring in the number of SRAM cells.

Note that while the ring oscillator 200 determines the write speed of the SRAM cells, the ring oscillator 200 is more specifically determining how long it takes for the storage node SNB to charge when changing from a "0" to a "1".

In another embodiment of the present invention, the wordline WL can be tied to Vdd, i.e., at "1", all the time. As such, the ring oscillator would still work and would oscillate faster since there would be no delay caused by waiting for the wordline to turn on before programming the SRAM cells. It can be determined how long it takes to turn on the wordline WL by comparing the oscillation frequencies of two scenarios: when the wordline is toggled and when the wordline WL is always turned on.

In another embodiment of the present invention, the OR gate in the repeating units can be connected to a separate power source in order to modulate the wordline WL. The voltage can be used to modulate the speed at which the wordline turns on. Accordingly, the relationship between the wordline voltage and the oscillation frequency can be used to analyze wordline characteristics.

To ensure that the bulk of the delay is represented by the writing process, it would be important to minimize other delays within the circuit. For example, the inverters 220 and 222, the transistor 230, and the OR gate 240 can be designed with optimal device sizes, device types, and with an optimal fanout to minimize their associated delays. To minimize bitline delay, the test structure can be designed to have a minimal number of rows.

Figure 4:
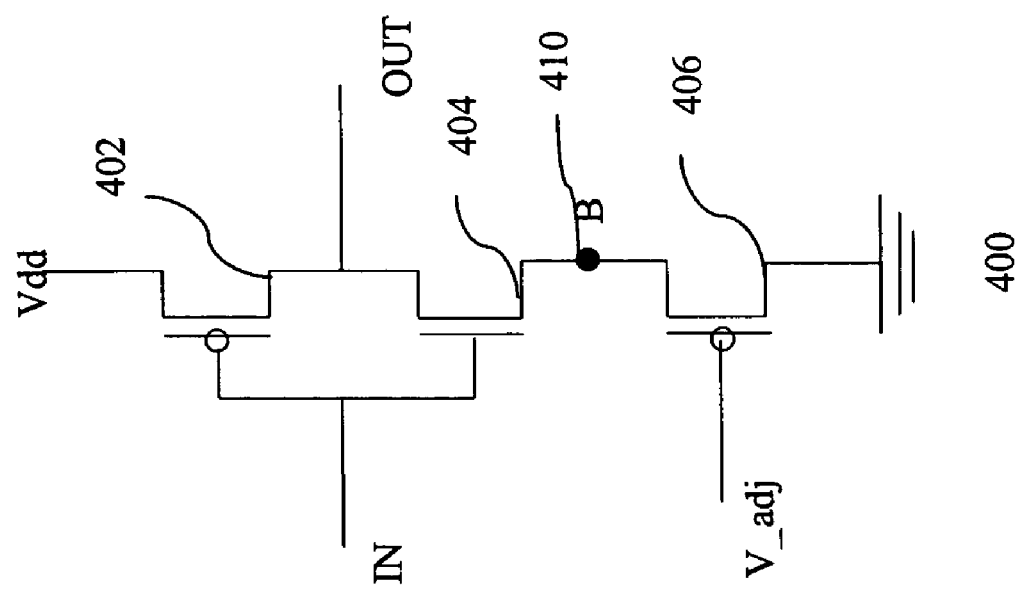
FIG. 4 is a schematic diagram of an inverter having an adjustable trip point, which can be used to implement the inverter of FIG. 3 in accordance with the present invention.

FIG. 4 is a schematic diagram of an inverter 400 having an adjustable trip point, which can be used to implement the inverter 220 of FIG. 3 in accordance with the present invention. The inverter 400 includes a PMOS transistor 402 and an NMOS transistor 404. The inverter 400 also includes a PMOS transistor 406 (preferably a high performance device with relatively low Vt), which offsets the minimum voltage at a node 410 with respect to Vss by amount equal to |Vt| of the PMOS transistor 406 when V_adj=0V. Accordingly, the voltage trip point for the pull-down operation of the inverter 400 is shifted. This allows the storage node SNB to rise to a higher voltage before tripping the next stage in the ring oscillator. An adjustable gate voltage V_adj at the gate of the PMOS transistor 406 can be applied to provide a variable or "tunable" trip point. In general the voltage at point B is given by |Vtp|+V_adj. Providing a variable trip point ensures that the inverter 220 switches at an optimal speed, not too slow or too fast.

The tunable trip point can be implemented in the other inverters corresponding to the inverter 400 (in the other repeater cells) by coupling to one node or probe pad, the gates of the respective PMOS transistors in the other inverters.

An advantage of the present invention is that it accurately verifies the write time for SRAM cells without modifying the SRAM cells within the test structure. This avoids altering the transient AC characteristics of the SRAM cells when predicting the performance of the SRAM cells. Accordingly, the internal node capacitance is accurately represented.

According to the system and method disclosed herein, the present invention provides numerous benefits. For example, it accurately verifies the write performance of complex multiport memories. Embodiments of the present invention are also designed relatively simply by including all of the additional elements in the repeating structure using the same column pitch as the memory cell.

A circuit for measuring the performance of a plurality of memory cells has been disclosed. The present invention has been described in accordance with the embodiments shown. One of ordinary skill in the art will readily recognize that there could be variations to the embodiments, and that any variations would be within the spirit and scope of the present invention. Accordingly, many modifications may be made by one of ordinary skill in the art without departing from the spirit and scope of the appended claims.

We claim:

1. A circuit for measuring the performance of a memory cell, the circuit comprising:
    a ring oscillator, wherein the ring oscillator comprises a plurality of memory cells, wherein the performance of the memory cell can be determined from an oscillation frequency of the ring oscillator, wherein the ring oscillator further comprises:
        a plurality of repeating units;
        at least one inverter coupled to the plurality of repeating units, wherein an output of the at least one inverter ensures that wordlines of the plurality of memory cells are turned on during a write operation; and
        a NAND gate coupled to the at least one inverter.

2. The circuit of claim 1 wherein each memory cell of the plurality of memory cells comprises at least one storage node, wherein the time it takes to charge the at least one storage node can be determined from the oscillation frequency of the ring oscillator.

3. The circuit of claim 1 wherein the ring oscillator has a first cycle and a second cycle, wherein during the first cycle a data state zero is written to the plurality of memory cells, and wherein during the second cycle a data state one is written to the plurality of memory cells.

4. The circuit of claim 3 wherein a ratio between the first cycle and the second cycle is used to determine transient characteristics of the memory cell.

5. The circuit of claim 1 wherein the time it takes to turn on a wordline of the plurality of memory cells can be determined from the oscillation frequency of the ring oscillator.

6. The circuit of claim 1 wherein each memory cell of the plurality of memory cells is a static random access memory (SRAM) cell.

7. The circuit of claim 1 wherein the performance measured is a write performance.

8. The circuit of claim 1 wherein an output of the NAND gate ensures that wordlines of the plurality of memory cells are turned on during a write operation.

9. The circuit of claim 1 wherein each repeating unit of the plurality of units comprises:
    a memory cell of the plurality of memory cells, wherein the memory cell is adapted to be coupled to a wordline, to a first bitline, and to a second bitline; and
    a first circuit coupled to the memory cell, wherein the first circuit drives the first and second bitlines.

10. The circuit of claim 9 wherein the wordline is tied to Vdd.

11. The circuit of claim 9 wherein the wordline toggles after at least one cycle of the ring oscillator.

12. The circuit of claim 9 wherein the first circuit comprises:
    a first inverter coupled to the first bitline; and
    a transistor coupled to the first inverter and to the second bitline.

13. The circuit of claim 12 wherein the first inverter comprises a variable trip point.

14. The circuit of claim 12 wherein the first inverter comprises:
    an NMOS transistor;
    a first PMOS transistor coupled to the NMOS transistor; and a second PMOS transistor coupled to the first PMOS transistor, wherein the second PMOS transistor comprises a gate coupled to a variable voltage source.

15. The circuit of claim 9 wherein each repeating unit of the plurality of units further comprises a second circuit coupled to the memory cell, wherein the second circuit drives the wordline.

16. The circuit of claim 15 wherein the second circuit comprises:
a second inverter; and
an OR gate coupled to the second inverter and to the wordline.

17. A ring oscillator comprising:
at least one inverter; and
a NAND gate coupled to the at least one inverter;
a plurality of repeating units coupled to the NAND gate, wherein the plurality of repeating units comprises:
a memory cell of a plurality of memory cells, wherein the memory cell is adapted to be coupled to a wordline, to a first bitline, and to a second bitline;
a first circuit coupled to the memory cell, wherein the first circuit comprises a first inverter coupled to the first bitline, and a transistor coupled to the first inverter and to the second bitline; and
a second circuit coupled to the memory cell, wherein the second circuit comprises a second inverter coupled to the first inverter, and an OR gate coupled to the second inverter and to the wordline, wherein the performance of a memory cell can be determined from an oscillation frequency of the ring oscillator.

18. The ring oscillator of claim 17 wherein the wordline toggles after at least one cycle of the ring oscillator.

19. The ring oscillator of claim 17 wherein an output of the at least one inverter ensures that wordlines of the plurality of memory cells are turned on during a write operation.

20. The ring oscillator of claim 17 wherein an output of the NAND gate ensures that wordlines of plurality of memory cells are turned on during a write operation.

21. A system for measuring the performance of a memory cell, the system comprising:
a plurality of memory cells; and
a ring oscillator, wherein the plurality of memory cells are integrated into the ring oscillator, wherein the performance of the memory cell can be determined from an oscillation frequency of the ring oscillator, wherein the ring oscillator further comprises:
a plurality of repeating units;
at least one inverter coupled to the plurality of repeating units, wherein an output of the at least one inverter ensures that wordlines of the plurality of memory cells are turned on during a write operation; and
a NAND gate coupled to the at least one inverter.

22. The system of claim 21 wherein each memory cell of the plurality of memory cells comprises at least one storage node, wherein the time it takes to charge the at least one storage node can be determined from the oscillation frequency of the ring oscillator.

23. The system of claim 21 wherein the ring oscillator has a first cycle and a second cycle, wherein during the first cycle a data state zero is written to the plurality of memory cells, and wherein during the second cycle a data state one is written to the plurality of memory cells.

24. The system of claim 23 wherein a ratio between the first cycle and the second cycle is used to determine transient characteristics of the memory cell.

25. The system of claim 21 wherein the time it takes to turn on the wordline of the plurality of memory cells can be determined from the oscillation frequency of the ring oscillator.

26. The system of claim 21 wherein each memory cell of the plurality of memory cells is a static random access memory (SRAM) cell.

27. The system of claim 21 wherein the performance measured is a write performance.

28. The system of claim 21 wherein an output of the NAND gate ensures that wordlines of the plurality of memory cells are turned on during a write operation.

29. The system of claim 21 wherein each repeating unit of the plurality of units comprises:
a memory cell of the plurality of memory cells, wherein the memory cell is adapted to be coupled to a wordline, to a first bitline, and to a second bitline; and
a first circuit coupled to the memory cell, wherein the first circuit drives the first and second bitlines.

30. The system of claim 29 wherein the wordline is tied to Vdd.

31. The system of claim 29 wherein the wordline toggles after at least one cycle of the ring oscillator.

32. The system of claim 29 wherein the first circuit comprises:
a first inverter coupled to the first bitline; and
a transistor coupled to the first inverter and to the second bitline.

33. The system of claim 32 wherein the first inverter comprises a variable trip point.

34. The system of claim 32 wherein the first inverter comprises:
an NMOS transistor;
a first PMOS transistor coupled to the NMOS transistor; and
a second PMOS transistor coupled to the first PMOS transistor, wherein the second PMOS transistor comprises a gate coupled to a variable voltage source.

35. The system of claim 29 wherein each repeating unit of the plurality of units further comprises a second circuit coupled to the memory cell, wherein the second circuit drives the wordline.

36. The system of claim 35 wherein the second circuit comprises:
a second inverter; and
an OR gate coupled to the second inverter and to the wordline.

* * * * *